US012787170B2

(12) United States Patent
Sawyer et al.

(10) Patent No.: US 12,787,170 B2
(45) Date of Patent: Nov. 3, 2026

(54) POSITION DETECTION USING A CAPACITIVE SENSOR

(71) Applicant: Lenovo Global Technology (UnitedStates) Inc., Morrisville, NC (US)

(72) Inventors: Paul Sawyer, Garner, NC (US); Timothy M Wiwel, Raleigh, NC (US); Walter A Goodman, Cary, NC (US); Matt Crownover, Apex, NC (US); Bradley Paul Antczak, Rolesville, NC (US)

(73) Assignee: Lenovo Global Technology (United States) Inc., Morrisville, NC (US)

( * ) Notice: Subject to any disclaimer, the term of this patent is extended or adjusted under 35 U.S.C. 154(b) by 206 days.

(21) Appl. No.: 18/892,419

(22) Filed: Sep. 22, 2024

(65) Prior Publication Data

US 2026/0089842 A1 Mar. 26, 2026

(51) Int. Cl.
*H05K 1/14* (2006.01)
*H05K 1/11* (2006.01)

(52) U.S. Cl.
CPC ............. *H05K 1/117* (2013.01); *H05K 1/141* (2013.01); *H05K 2201/10151* (2013.01)

(58) Field of Classification Search
CPC ................... H05K 1/117; H05K 1/141; H05K 2201/10151
USPC .......................................................... 361/803
See application file for complete search history.

(56) References Cited

U.S. PATENT DOCUMENTS

| | | | | |
|---|---|---|---|---|
| 6,128,196 | A * | 10/2000 | Hoyle, Jr. | H05K 7/1409 206/706 |
| 7,453,444 | B2 | 11/2008 | Geaghan | |
| 2002/0118529 | A1 * | 8/2002 | Babin | G06F 1/182 361/818 |
| 2008/0080152 | A1 * | 4/2008 | Duppong | H05K 3/301 361/760 |

OTHER PUBLICATIONS

"Rotary encoder", Wikipedia, https://en.wikipedia.org/wiki/rotary_encoder, Retrieved from the Internet Jul. 17, 2024.

* cited by examiner

*Primary Examiner* — Binh B Tran
(74) *Attorney, Agent, or Firm* — Jeffrey L. Streets

(57) ABSTRACT

An expansion board includes a printed circuit board (PCB), an electronic subsystem and a connector for receiving power from, and communicating with, a motherboard. The expansion board also includes a capacitive sensor for close non-contact alignment with a unique pattern of inwardly-directed protrusions formed in a metal wall of a chassis containing the motherboard when the connector is fully seated in an expansion slot on the motherboard. The capacitive sensor is configured to detect changes in capacitance at each location of a protrusion in the unique pattern when the capacitive sensor is positioned in close non-contact alignment with the unique pattern. Furthermore, the expansion board comprises a microcontroller connected to the output of the capacitive sensor to receive from the capacitive sensor an output signal identifying the relative positions of the protrusions.

20 Claims, 7 Drawing Sheets

80

82 84

| Unique Pattern | Location of the Expansion Board |
|---|---|
| 001 | Front, Left of Server / Chassis |
| 010 | Rear, Left of Server / Chassis |
| 011 | Rear, Right of Server / Chassis |
| 100 | Front, Right of Server / Chassis |

POSITION DETECTION USING A CAPACITIVE SENSOR

BACKGROUND

The present disclosure relates to methods and apparatus for detecting a position of a circuit board installed within a chassis.

BACKGROUND OF THE RELATED ART

Printed circuit boards (PCBs) are typically enclosed in a metal chassis to provide mechanical protection, electromagnetic shielding, and thermal management. The metal chassis safeguards the relatively delicate circuitry of the PCBs from physical damage, dust, and moisture, which could lead to short circuits or component failures. Additionally, the metal chassis acts as a shield against electromagnetic interference (EMI) and radio frequency interference (RFI), which can disrupt the printed circuit board's performance by causing signal degradation or noise. Thermal management is another crucial aspect of a chassis, as the metal enclosure helps dissipate heat generated by the electronic components, ensuring optimal performance and preventing overheating. Specifically, the chassis may control or guide airflow across the printed circuit boards in a predictable direction, such as a front face of the chassis to a back face of the chassis. Overall, enclosing printed circuit boards in a metal chassis enhances their reliability, durability, and functionality.

Expansion boards, also known as expansion cards, are crucial components based on printed circuit boards that can be installed in a computer to enhance or extend its functionality and performance. Common types of expansion boards or expansion cards include graphics cards, sound cards, network interface cards, storage controller cards, USB or other input/output (IO) expansion cards, and memory expansion cards. Graphics cards handle rendering and display tasks, significantly improving visual quality and processing power for gaming and professional applications. Sound cards enhance audio performance by providing high-quality sound processing and advanced features like surround sound. Network interface cards (NICs) enable wired and/or wireless network connectivity, allowing for faster and more stable connections to one or more networks, such as a local area network (LAN) or the Internet. Storage controller cards, such as RAID (Redundant Array of Independent Disks) cards, manage multiple storage drives, improving data redundancy and performance. Additionally, I/O expansion cards or USB expansion cards add extra I/O ports and/or USB ports to support more peripherals. Memory expansion cards provide additional memory supporting the operation of the computer. Each type of expansion board is designed to address specific needs, providing a customizable approach to optimizing and upgrading computer systems.

Unfortunately, there are so many different types of expansion cards and so many expansion slots on a motherboard that it is possible for a technician to install an expansion card in the wrong or unintended slot.

BRIEF SUMMARY

Some embodiments provide an expansion board comprising a printed circuit board, an electronic subsystem supported on the printed circuit board and configured to expand the capabilities of a motherboard, and a connector for connecting the electronic subsystem to the motherboard, wherein the connector includes conductors for receiving power from the motherboard and conductors for communicating with the motherboard. The expansion board further comprises a capacitive sensor secured to the printed circuit board in a predetermined physical position and orientation on the printed circuit board for close non-contact alignment with a unique pattern of inwardly-directed protrusions formed in an exterior metal wall of a chassis containing the motherboard when the connector is fully seated in an expansion board connector on the motherboard, wherein the capacitive sensor is configured to detect changes in capacitance at each location of a protrusion in the unique pattern of inwardly-directed protrusions when the capacitive sensor is positioned in close non-contact alignment with the unique pattern of protrusions. Furthermore, the expansion board comprises a microcontroller connected to the output of the capacitive sensor to receive from the capacitive sensor an output signal identifying the relative positions of the protrusions.

Some embodiments provide a system comprising a chassis including a plurality of sheet metal walls and a plurality of unique patterns of inwardly directed protrusions formed in the sheet metal walls in predetermined locations. The system further comprises a motherboard secured in the chassis and including a plurality of expansion board connectors, wherein each expansion board connector is secured at a specific location on the motherboard to have a predetermined physical spacing and orientation relative to the predetermined location of one of the unique patterns of protrusions. Furthermore, the system comprises one or more expansion boards, each expansion board including a printed circuit board, an electronic subsystem supported on the printed circuit board and configured to expand the capabilities of the motherboard, and a connector for connecting the electronic subsystem to the motherboard, wherein the connector includes conductors for receiving power from the motherboard and conductors for communicating with the motherboard. Each expansion board further comprises a capacitive sensor secured to the printed circuit board in a predetermined physical position and orientation on the printed circuit board for close non-contact alignment with one of the unique patterns of inwardly-directed protrusions when the connector is fully seated in one of the expansion board connectors on the motherboard, wherein the capacitive sensor is configured to detect changes in capacitance for each protrusion in the unique pattern of inwardly-directed protrusions that is positioned in close non-contact alignment with the capacitive sensor. Each expansion board also comprises a microcontroller connected to the output of the capacitive sensor to receive from the capacitive sensor an output signal identifying the relative positions of the protrusions.

DETAILED DESCRIPTION

Figure 1A:
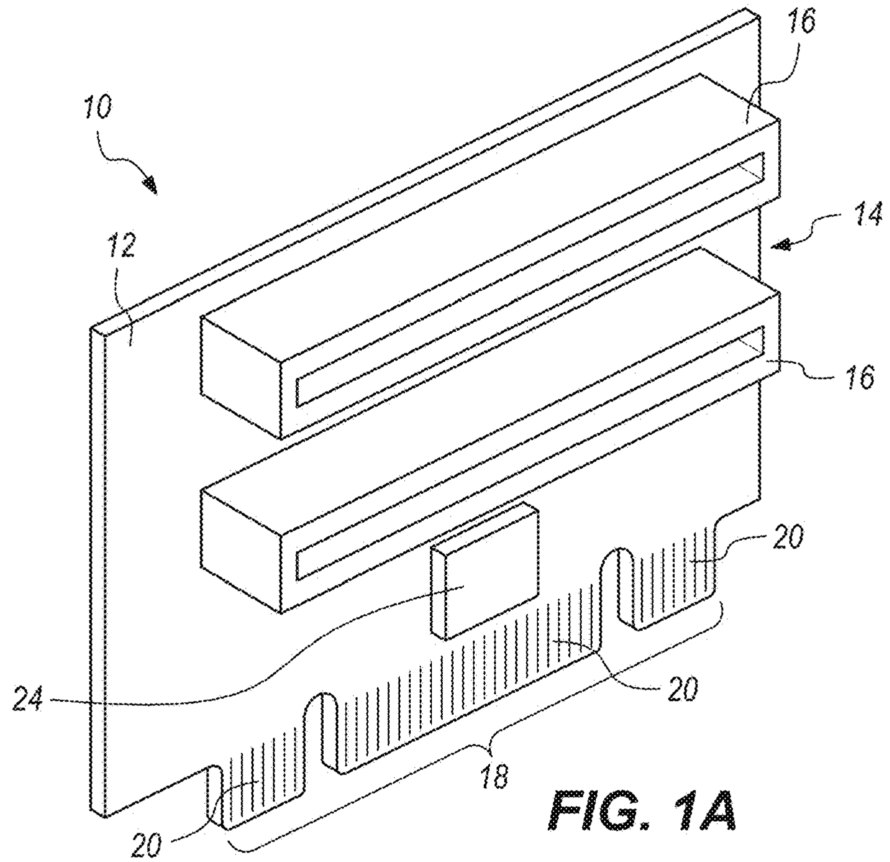
FIGS. 1A-B are front and back perspective views of an expansion board according to one embodiment.

Some embodiments provide an expansion board comprising a printed circuit board, an electronic subsystem supported on the printed circuit board and configured to expand the capabilities of a motherboard, and a connector for connecting the electronic subsystem to the motherboard, wherein the connector includes conductors for receiving power from the motherboard and conductors for communicating with the motherboard. The expansion board further comprises a capacitive sensor secured to the printed circuit board in a predetermined physical position and orientation on the printed circuit board for close non-contact alignment with a unique pattern of inwardly-directed protrusions formed in an exterior metal wall of a chassis containing the motherboard when the connector is fully seated in an expansion board connector on the motherboard, wherein the capacitive sensor is configured to detect changes in capacitance at each location of a protrusion in the unique pattern of inwardly-directed protrusions when the capacitive sensor is positioned in close non-contact alignment with the unique pattern of protrusions. Furthermore, the expansion board comprises a microcontroller connected to the output of the capacitive sensor to receive from the capacitive sensor an output signal identifying the relative positions of the protrusions.

The electronic subsystem supported on the printed circuit board may form various types of expansion boards, also referred to as expansion cards, that may be configured to expand the capabilities or performance of a motherboard in many ways. Without limitation, the electronic subsystem may form an expansion board that operates as a graphics card, sound card, network interface card, storage controller card, USB expansion card, memory expansion card (such as a Computer Express Link (CXL) memory module), data storage drive backplane, power distribution board, or power interface board. Furthermore, the expansion board may be a riser card. A riser card is a type of expansion board that connects to the motherboard and provides additional expansion slots for receiving additional expansion boards. A riser card will often change the orientation of the expansion cards so that they fit within the chassis in which the motherboard is installed. A daughterboard or mezzanine board is an expansion card that connects directly to another printed circuit board, such as riser card, and is often positioned in a plane that is parallel to the motherboard.

The expansion board includes some form of a connector or cable for connecting the expansion board to the motherboard or main system board. The connector typically supports both a power connection that supplies power to the expansion board from the motherboard and a communication interface that supports communication between the motherboard and the expansion board. For example, the expansion board may have a card edge connector including a set of electronic contacts that engage with contacts within an expansion slot, such as a PCI expansion slot, that is part of the motherboard. Accordingly, the expansion board may be easily installed and removed from the expansion slot or connector slot. The edge connector is preferably fully seated within the connector slot on the motherboard to improve the physical and electrical connection therebetween and also to register the vertical position of the capacitive sensor.

The capacitive sensor may be constructed in a manner similar to a capacitive touchscreen but without requiring actual contact. For example, the capacitive sensor may have a sensor area using multiple layers of materials designed to detect and respond to the proximity of a metal structure at multiple points across the sensor with high precision and responsiveness. The sensor may include an insulating substrate coated with a conductive material, such as indium tin oxide (ITO), arranged in a grid pattern of horizontal lines on one side of the substrate and vertical lines on the other side of the substrate. These conductive layers form an array of tiny capacitors across the substrate surface area. Other optional protective layers, such as a protective polymer film, may be added to ensure durability without interfering with the sensor's functionality. In one non-limiting embodiment, the capacitive sensor may be a projected capacitance touch (PCT) sensor using mutual capacitive sensors at each intersection between electrode rows and electrode columns on opposing sides of an insulating substrate. Furthermore, the capacitive sensor and the microcontroller may be combined in a single integrated circuit package.

The capacitive sensor can sense a metal object without direct contact by detecting changes in the local electric field where the object approaches. The sensor generates an electrostatic field, and when a conductive object like metal enters this field, it alters the distribution of electric charges, causing a change in capacitance. The sensor detects this change as a variation in the electric field, allowing it to sense the presence, proximity, or movement of the metal object even without physical contact. This ability to detect changes in capacitance makes capacitive sensors ideal for touchless interfaces and proximity sensing applications, where they can accurately register the presence of objects based on their conductive properties.

The chassis containing the motherboard may be a standard chassis including a plurality of exterior metal walls, which may be formed with sheet metal. The form factor of the chassis may vary from one application to another, but the chassis may, without limitation, be a rack mountable server chassis. The plurality of unique patterns of inwardly directed protrusions are preferably formed in one or more of the exterior metal walls using standard metalworking processes, such as pressing the sheet metal with a dimple die. The one or more exterior metal walls containing the unique patterns may be the left or right sides, the front or back ends, and/or the top or bottom covers, although a chassis may not have an exterior wall on all sides or may have a grill or screen on some sides. Furthermore, the chassis may have other features, structures and openings without interfering with the operation of the embodiments disclosed herein. The chassis will preferably include mounting holes to be used with plastic or metal standoffs to hold the motherboard in place. Furthermore, the mounting holes in the chassis and corresponding holes in the motherboard may be arranged in a desired hole pattern so that the motherboard can only be installed in a particular location and orientation within the chassis. This control over the placement of the motherboard within the chassis will assure that the expansion slots on the motherboard will have predetermined locations relative to the locations of the unique patterns of inward directed protrusions.

The unique patterns of inwardly directed protrusions may include any pattern that is distinguishable using the capacitive sensor. However, each pattern preferably has a plurality of protrusions that are uniquely arranged in one of a plurality of predetermined patterns or spacings. In one option, each of the unique patterns of inwardly directed protrusions may include a plurality of protrusions arranged in a unique combination of predetermined positions within a multi-position row or matrix. For example, a multi-position row may form a binary code, such as a three-digit binary code that can have up to eight unique patterns or values (i.e., 000, 001, 010, 011, 100, 101, 110, and 111; wherein a “0” indicates no dimple detected and a “1” indicates that a dimple was detected). While each pattern of inwardly directed protrusions should be “unique” or “different” within a given chassis, these patterns may be reused and perhaps identical across a plurality of chassis. In other words, a given unique pattern may be used to indicate a particular location in each chassis.

In some embodiments, each unique pattern of inwardly directed protrusions may include one or more alignment protrusions that are in a position that is common to each of the multiple unique patterns of inwardly directed protrusions. An alignment protrusion may be detected by the capacitive sensor to indicate a standard position within the pattern, such as a left-side alignment feature indicating that the unique portion of the pattern will be found to the right of the alignment feature.

In one option, the alignment protrusion or control point could be a single dimple that is the same or different than the other protrusions or other mechanical features. For example, a pattern of protrusions might include a left-most dimple that serves as the alignment protrusion and indicates that the location-identifying dimples are spaced in a right-hand direction from the alignment protrusion. So, in order to have 3 bits of slot identification, a unique pattern of inwardly directed protrusions might include a first dimple serving as the alignment protrusions and up to 3 additional protrusions that encode the identity of the location.

In some embodiments, the microcontroller, which may be a simple integrated circuit such as a field-programmable gate array (FPGA) or an application specification integrated circuit (ASIC), identifies a capacitive output signal level from the capacitive sensor for the alignment protrusion and determines, based on the identified capacitive output signal level, a range of capacitive output signal levels for positive indication of the presence and location of other protrusions within the unique pattern of inwardly directed protrusions. Adjusting or calibrating the levels or thresholds of capacitive output signals that should be used to distinguish between a protrusion being present and not present provides the technical benefit that wear, corrosion, or mechanical stresses in the chassis can be accounted for. For example, the capacitive sensor may detect the strength of a capacitive signal/response detected at the control point and expect a similar signal strength in order to make a positive detection of another mechanical feature. In this manner, if the chassis experiences sheet metal oxidation/corrosion, the capacitive sensors exhibit variations in output levels from one sensor to another or varies over time, or even if one set of protrusions or other mechanical features are more prominent than another set of protrusions or mechanical features in the same chassis or among several chassis, the capacitive sensor or the microcontroller connected to the capacitive sensor can use the control point to determine a signal level to be used as a positive indication of the presence of a mechanical feature and/or a signal level to be used as a negative indication of the presence (i.e., absence) of a mechanical feature. Optionally, the signal level that is accepted as a positive detection (perhaps read as a binary 1) or a negative detection (perhaps read as a binary 0) may be some percentage or absolute value above and/or below the output level for the control point. In other words, a range of signal levels may be established for indicating the presence of a protrusion.

In some embodiments, each of the protrusions in a particular unique pattern of inwardly directed protrusions and/or in every unique pattern of inwardly directed protrusions or other physical features may have a uniform size and shape, such as a dimple having a circular perimeter and a cross-section that is an arc. Furthermore, the exterior metal wall of the chassis may include a planar surface, where the protrusions extend outward from the planar surface by a first distance, such as between 1 and 10 millimeters inclusive, and a gap between the capacitive sensor and the protrusions may measure a second distance, such as between 2 and 10 millimeters inclusive at the closest point when the connector is fully seated in the expansion board connector on the motherboard.

In some embodiments, the microcontroller and/or a management controller (e.g., a baseboard management controller (BMC)) stores data identifying, for each of a plurality of unique patterns of protrusions, a location within the chassis that is associated with the unique pattern of inwardly directed protrusions. For example, the data may form a data structure, such as a table including multiple records, where each record (such as a row of the table) includes a first field (such as a first column) identifying one of the unique patterns and a second field (such as a second column) identifying the expansion board location within the server or chassis. Accordingly, the microcontroller on the expansion card and/or the management controller on the motherboard may use the output of the capacitive sensor to identify the location of the expansion board. In one option, the microcontroller uses the output signal identifying the relative positions of the protrusions to identify the unique pattern of inwardly directed protrusions and determines the expansion board to be installed in the location within the chassis that is associated with the identified unique pattern of inwardly directed protrusions. Furthermore, the microcontroller may be configured to provide the location where the expansion board is installed to a management controller on the motherboard. For example, the microcontroller may transmit the location information to the management controller or enable the management controller to read the location information from a register on the microcontroller.

In some embodiments, the expansion board is a riser card having one or more connectors slots secured on a first side of the printed circuit board, wherein the capacitive sensor is secured to a second side of the printed circuit board opposite the first side. Accordingly, when the riser card in fully seated (installed) in an expansion slot on the motherboard, the first side of the printed circuit board should be facing inward of the motherboard so that additional expansion cards installed in the one or more connector slots will extend over the top of the motherboard. Conversely, when the riser card in fully seated (installed) in an expansion slot on the motherboard, the second side of the printed circuit board should be the chassis wall so that the capacitive sensor faces the chassis wall in alignment with one of the unique patterns.

Some embodiments provide a system comprising a chassis including a plurality of sheet metal walls and a plurality of unique patterns of inwardly directed protrusions formed in the sheet metal walls in predetermined locations. The system further comprises a motherboard secured in the chassis and including a plurality of expansion board connectors, wherein each expansion board connector is secured at a specific location on the motherboard to have a predetermined physical spacing and orientation relative to the predetermined location of one of the unique patterns of protrusions. Furthermore, the system comprises one or more expansion boards, each expansion board including a printed circuit board, an electronic subsystem supported on the printed circuit board and configured to expand the capabilities of the motherboard, and a connector for connecting the electronic subsystem to the motherboard, wherein the connector includes conductors for receiving power from the motherboard and conductors for communicating with the motherboard. Each expansion board further comprises a capacitive sensor secured to the printed circuit board in a predetermined physical position and orientation on the printed circuit board for close non-contact alignment with one of the unique patterns of inwardly-directed protrusions when the connector is fully seated in one of the expansion board connectors on the motherboard, wherein the capacitive sensor is configured to detect changes in capacitance for each protrusion in the unique pattern of inwardly-directed protrusions that is positioned in close non-contact alignment with the capacitive sensor. Each expansion board also comprises a microcontroller connected to the output of the capacitive sensor to receive from the capacitive sensor an output signal identifying the relative positions of the protrusions.

In some embodiments of the system, the microcontroller stores data identifying, for each of a plurality of unique patterns of protrusions, a location within the chassis that is associated with the unique pattern of inwardly directed protrusions. The microcontroller uses the output signal identifying the relative positions of the protrusions to identify the unique pattern of inwardly directed protrusions and determines the expansion board is installed in the location within the chassis that is associated with the identified unique pattern of inwardly directed protrusions.

In some embodiments, the system further comprises a management controller on the motherboard connected to each of the plurality of expansion board connectors, wherein the management controller obtains the location where the expansion board is installed from the microcontroller.

In some embodiments of the system, each unique pattern of inwardly directed protrusions includes a plurality of protrusions arranged in a unique combination of predetermined positions within a multi-position row or matrix, wherein at least one of the plurality of protrusions is an alignment protrusion that is in a position that is common to each of the unique patterns of inwardly directed protrusions.

It should be recognized that the system embodiments may include any one or more aspects, features or embodiments of the expansion board. However, a system will typically have a motherboard with a plurality of expansion slots and the chassis will typically have a plurality of unique patterns of inwardly directed protrusions. Therefore, multiple instances of the expansion board embodiments may be included in the system. Furthermore, some embodiments may include a method of using the system as described herein, including installation of an expansion board into an expansion slot on the motherboard that is secured in a chassis where there are unique patterns of inwardly directed protrusions for identifying various locations within the chassis or server. The operations of any method performed by the microcontroller and/or the management controller may be embodied in a computer program product.

Some embodiments provide the technical benefit that a motherboard and/or an expansion board may determine or confirm where the expansion board has been installed. It is a further technical benefit that the expansion board includes a non-contact capacitive sensor that does not require the same degree of dimensional precision during chassis manufacturing as would be required to implement a contact sensor and will not cause mechanical wear that could degrade the protrusions or electrical contacts over time.

Figure 1B:
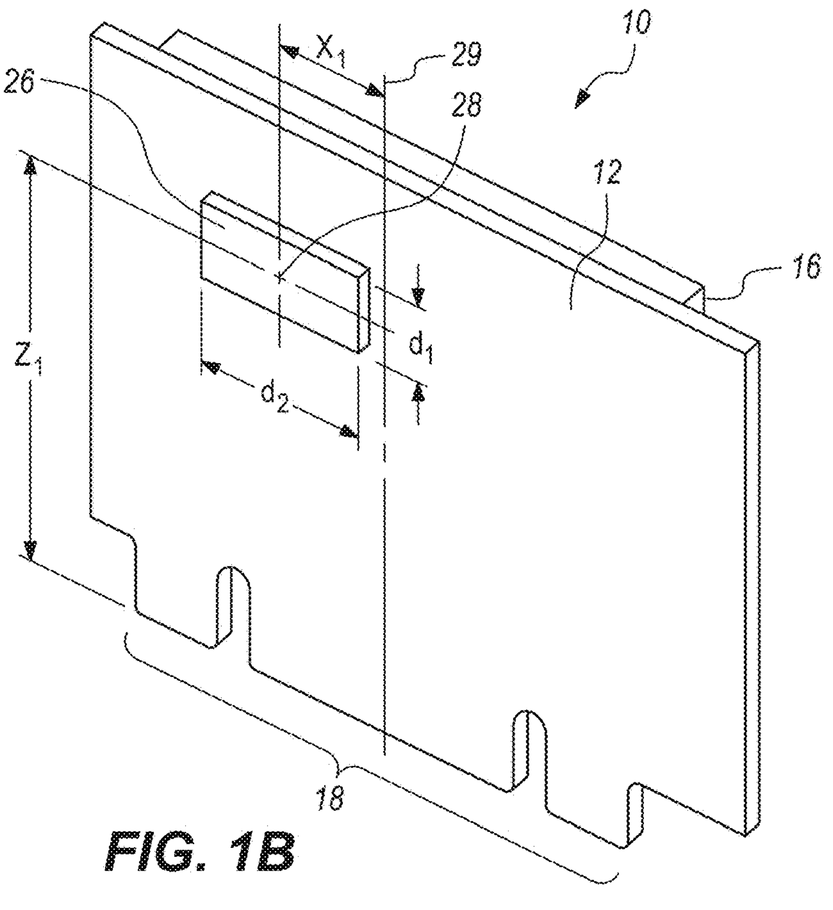

FIGS. 1A-B are front and back perspective views of an expansion board 10 according to one embodiment. The expansion board 10 is based on a printed circuit board 12 that supports an electronic subsystem 14 configured to expand the capabilities of a motherboard (not shown). The capabilities of the electronic subsystem 14 may vary widely to form, for example, a graphics card, sound card, network interface card, storage controller card, I/O or USB expansion card and memory expansion card. However, the illustrated electronic subsystem 14 includes multiple expansion card slots 16 such that the expansion board 10 forms a riser card capable of receiving and supporting the operation of two daughter cards (not shown).

The expansion board 10 further includes a connector 18 in the form of a card edge connector for connecting the electronic subsystem 14 to the motherboard. The connector includes conductors, such as conductive pads 20, for receiving power from the motherboard and for communicating with the motherboard. The conductors are connected to the electronic subsystem 14 and any other components on the expansion card 10 that require communication, power or other connection to the motherboard through the connector 18. The first side of the expansion board 10 is shown in FIG. 1A and secures a microcontroller 24 for use with a capacitive sensor shown in FIG. 1B.

FIG. 1B is a perspective view of a second side of the expansion board 10 where a capacitive sensor 26 is secured to the printed circuit board 12 in a predetermined physical position and orientation. For example, the capacitive sensor 26 has a sensor surface area defined by a vertical dimension ($d_1$) and a horizontal dimension ($d_2$). If the position of the capacitive sensor 26 is described by a center point 28, then the capacitive sensor 26 may be said to have a predetermined physical position that is a first distance ($Z_1$) above the lower edge of the edge connector 18 and a second distance ($X_1$) leftward from the centerline 29 of the expansion board 10. Optionally, the capacitive sensor 26 may be included in an integrated circuit that incorporates the microcontroller 24 shown in FIG. 1A. Combining these two components on the second side of the printed circuit board 12 may simplify the design and reduce the number of modifications that are necessary to make the expansion board 10 include the location detection features of the various embodiments.

Figure 2A:
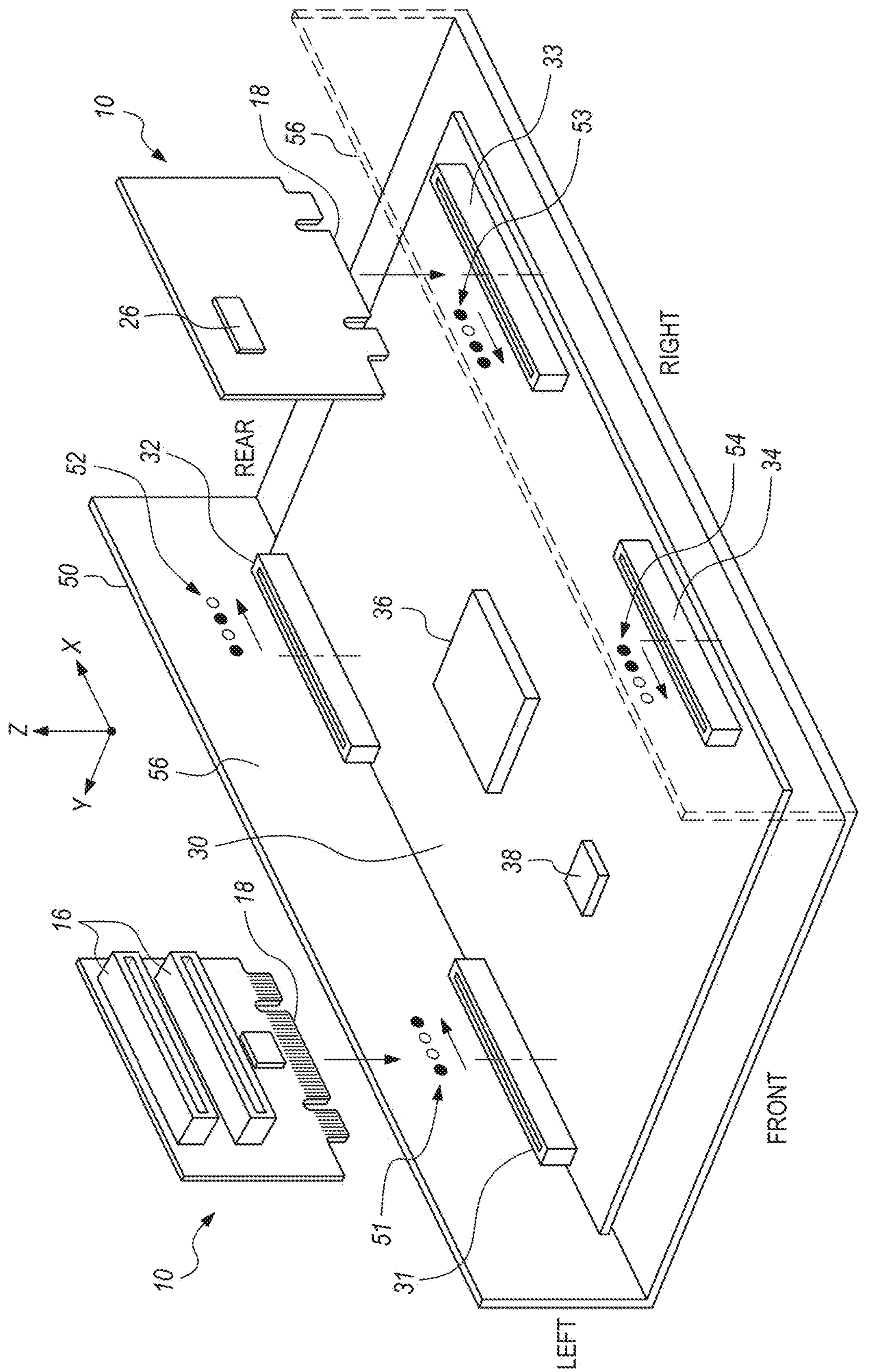
FIGS. 2A-B are perspective and top views of a motherboard secured in a chassis, where the motherboard includes four expansion slots suitable for connecting an expansion board.

FIG. 2A is a perspective view of a motherboard 30 secured in a fixed position within a chassis 50, where the motherboard 30 includes four expansion slots 31, 32, 33, 34 suitable for connecting the expansion boards 10 (only two shown). The motherboard 30 may include many other components to form an operative computer or server but is shown having a central processing unit (CPU) 36 and a management controller 38, such as a baseboard management controller (BMC).

The expansion boards 10 are oriented to be installed into the expansion slots 31, 33 with their expansion slots 16 directed toward the central area of the motherboard 30 and their capacitive sensors 26 directed outward toward the chassis walls 56. When installed, the edge connectors 18 will be fully seated into the expansion slots 31, 33. For the purpose of consistency between Figures, FIG. 2A establishes an X-direction (longitudinal direction) from front to rear of the chassis 50, a Y-direction (lateral direction) from left to right of the chassis 50, and a Z-direction (vertical direction) from bottom to top of the chassis 50. Front, rear and top sides, walls or panels, such as grills or screens, have been omitted to better illustrate the invention but would typically be included. Furthermore, the side walls 56 are shown to include unique patterns of inwardly directed protrusions 51, 52, 53, 54, where one unique pattern is physically positioned adjacent a corresponding one of the expansion slots 31, 32, 33, 34. The exact position of each unique pattern is directly related to the position of each expansion slot as will be described in greater detail in subsequent Figures. However, the unique patterns may be employed in other walls (i.e., side walls, end walls, bottom walls, etc.) of the chassis 50 so long as the installed positions of the expansion cards will position the capacitive sensors in close noncontact alignment with the unique pattern.

Figure 2B:
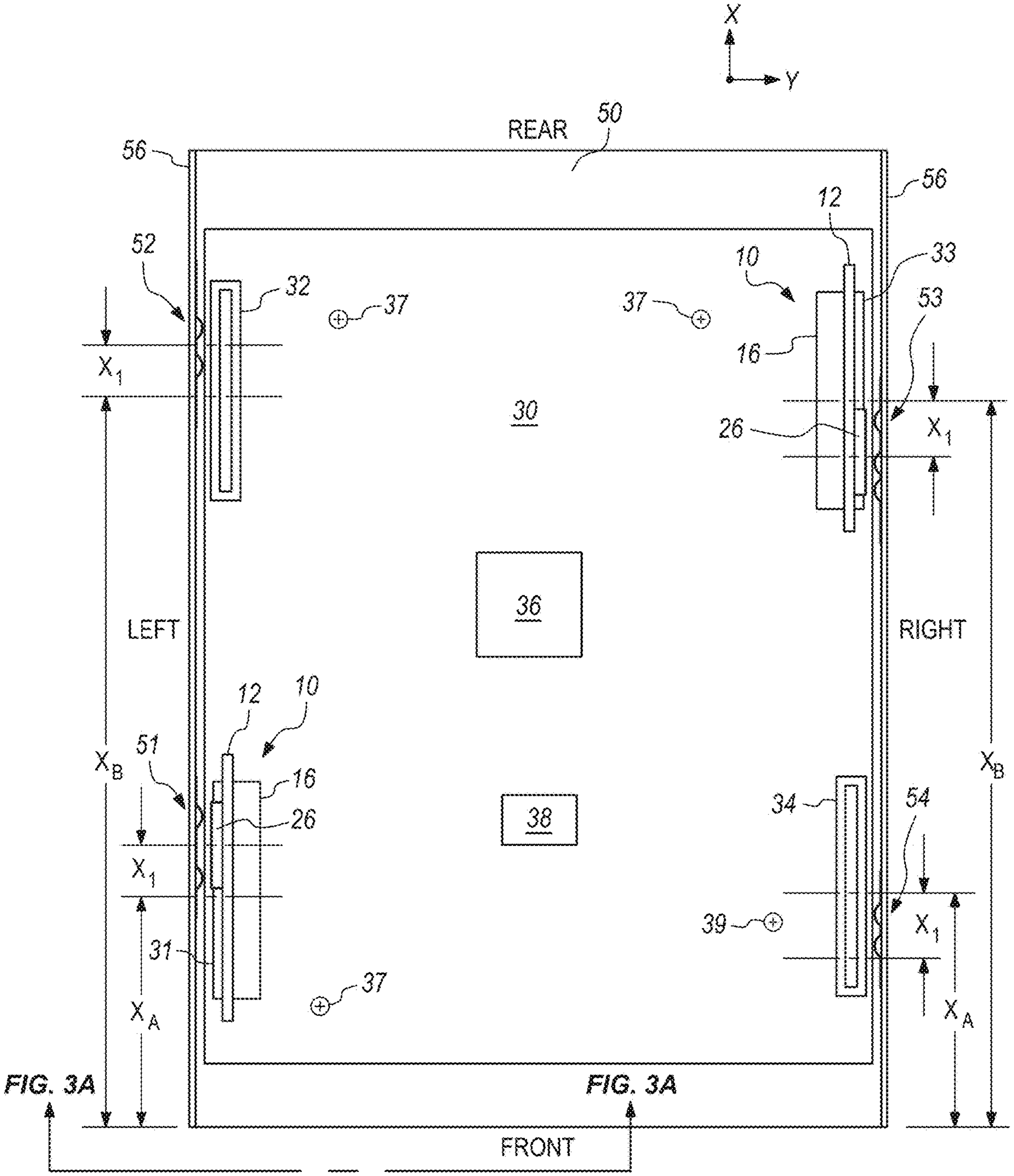
Figure 3B:
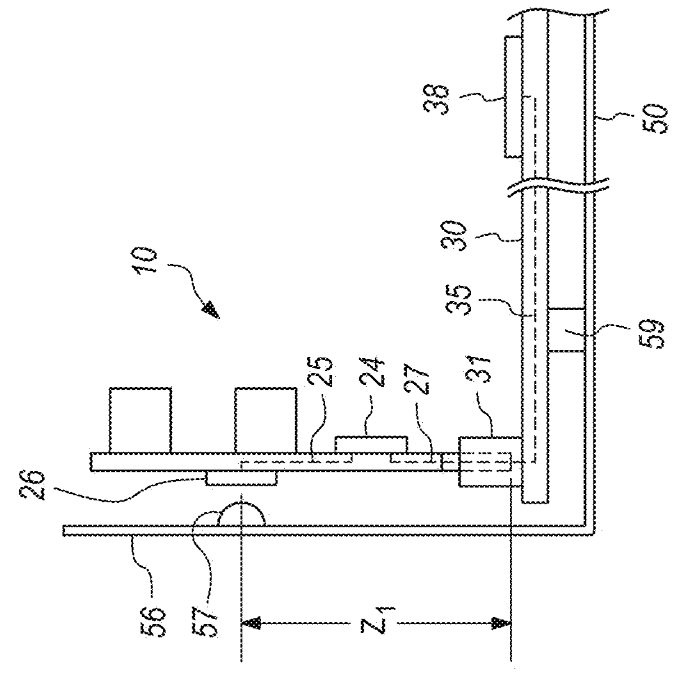
FIGS. 3A-B are partial front side views of the motherboard secured in the chassis before and after installation of an expansion board into an expansion slot on the motherboard.

The expansion card 10 are shown in their installed (fully seated) positions in FIGS. 2B and 3B. However, FIG. 2A illustrates the unique patterns of inwardly directed protrusions 51, 52, 53, 54 in a predetermined physical location relative to the expansion slots 31, 32, 33, 34. In this example, there are four possible locations for an expansion board, such as a PCIe riser card. Accordingly, the chassis walls 56 have a unique pattern of dimples at each of the four possible locations. A first location in the left, front wall of the chassis could have a pattern 51 of four-dimples described as 1001 (i.e., dimple (1), no dimple (0), no dimple (0), dimple (1)), a second location could have a four-dimple pattern 52 described as 1010, a third location could have a dimple pattern 53 described as 1011, and a fourth location could have a dimple pattern 54 described as 1100. If an expansion board 10 is installed in the first expansion slot 31, then the capacitive sensor 26 on the second side of the expansion board 10 will detect the dimple pattern 51 in the chassis wall 56 and read the code 1001. If an expansion board 10 is installed in the third expansion slot 33, then the capacitive sensor 26 on the second side of the expansion board 10 will detect the dimple pattern 53 in the chassis wall 56 and read the code 1011.

FIG. 2B is a plan (top) view of the chassis 50 and motherboard 30 consistent with FIG. 2A. A first unit of the expansion board 10 has been fully seated in the expansion slot 31 on the motherboard 30 so that the expansion slots 16 are inwardly directed and the capacitive sensor 26 is outwardly directed toward the left chassis wall 56. Similarly, a second unit of the expansion board 10 has been fully seated in the expansion slot 33 on the motherboard 30 so that the expansion slots 16 are inwardly directed and the capacitive sensor 26 is outwardly directed toward the right chassis wall 56. For the purpose of this illustration, the expansion slots 32, 34 are left unused.

In this non-limiting example, the center of the front expansion slots 31, 34 are set back a distance $X_A$ from the front edge of the chassis 50 and the center of the rear expansion slots 32, 33 are set back a distance $X_B$ from the front edge of the chassis 50. Also, consistent with FIG. 1B, the capacitive sensors 26 are offset (to the left as viewed from the second side of the expansion board 10) a distance $X_1$ from the center of the expansion board 10. Accordingly, the center of the unique pattern 51 must be set back a distance $X_A+X_1$ from the front edge of the chassis 50 so that it is in longitudinal alignment with the capacitive sensor 26 when the expansion board 10 is installed in expansion slot 31. Similarly, the center of the unique pattern 52 must be set back a distance $X_B+X_1$ from the front edge of the chassis 50 so that it is positioned to be in longitudinal alignment with the capacitive sensor 26 of an expansion board 10 if it were installed in the expansion slot 32. On the other side of the chassis 50, the center of the unique pattern 53 must be set back a distance $X_B-X_1$ from the front edge of the chassis 50 so that it is in longitudinal alignment with the capacitive sensor 26 when the expansion board 10 is installed in expansion slot 33. Still further, the center of the unique pattern 55 must be set back a distance $X_A-X_1$ from the front edge of the chassis 50 so that it is positioned to be in longitudinal alignment with the capacitive sensor 26 of an expansion board 10 if it were installed in the expansion slot 34. Note that the capacitive sensor may be centered on the expansion board or even offset in the opposite direction from the centerline, but an adjusted position of the unique patterns should then be similarly adjusted.

Note that the motherboard 30 is secured in the chassis with four screws 37, 39, where the hole for screw 39 is set back further from the front edge of the motherboard 30 and chassis 50 so that the motherboard 30 can only be installed in the illustrated orientation. If the motherboard were oriented 180 degrees of rotation from the illustrated orientation, the holes in the motherboard 30 would not align the mounting pegs or spacers of the chassis 50.

Figure 3A:
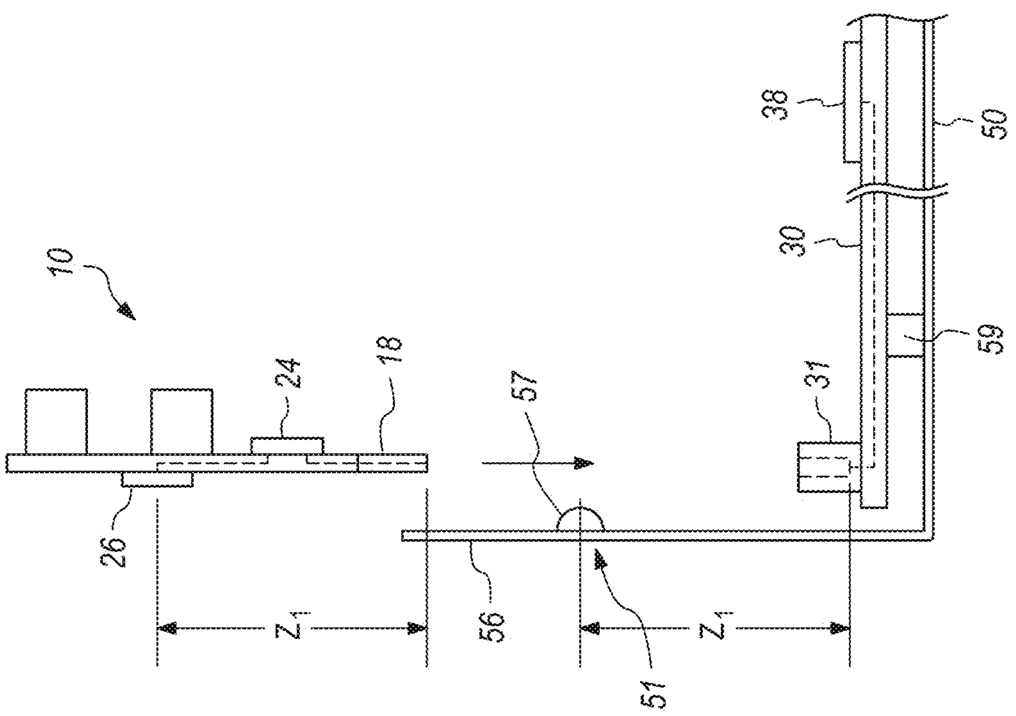

FIGS. 3A-B are partial front side views before and after installation of an expansion board 10 into the expansion slot 31 on of the motherboard 30 as seen from line 3A-3A in FIG. 2B. In FIG. 3A, the motherboard 30 is secured in the chassis 50 on spacers 59, which positions the expansion slot 31 in a fixed predetermined position relative to the chassis sidewall 56. The unique pattern 51 of inwardly directed protrusions (one protrusion 57 shown in this view) is centered at a distance $Z_1$ above the lowest point in the expansion slot 31 that the edge connector 18 will contact when fully seated. This is the same distance $Z_1$ shown between the lower edge of the edge connector 18 and the center of the capacitive sensor 26.

In FIG. 3B, the expansion board 10 has been installed by fully seating the edge connector 18 into the expansion slot 31. As a result, the vertical center of capacitive sensor 26 is aligned with the vertical center of the unique pattern 51 of protrusions (only protrusion 57 is seen). Note that some dimensional variation may be tolerated when the vertical dimension $d_1$ and longitudinal dimension $d_2$ of the capacitive sensor is slightly larger than necessary. Also note that the capacitive sensor 26 is now positioned in close, noncontact alignment (i.e., face-to-face) with the unique pattern 51 of inwardly directed protrusions formed in the exterior metal wall 56 of the chassis 50.

In this installed position, the capacitive sensor 26 will receive power from the motherboard through a conductor in the expansion slot 31 and a conductor in the expansion board 10. The capacitive sensor 26 may then generate an electrostatic field and detect changes in capacitance at each location where there is a protrusion 57 in the unique pattern 51 of inwardly directed protrusions. An output signal from the capacitive sensor 26 is received by the microcontroller 24 via a conductive signal line 25 (shown as a dashed line). The microcontroller 24 may further communicate with the management controller 38 via the conductive signal line 27 in or on the expansion card and the conductive signal line 35 in or on the motherboard 30. In some embodiments, the microcontroller 24 may monitor the capacitive sensor 26, process the input from the capacitive sensor 26, and provide the location or the location code to the management controller 38 on the motherboard 30. For example, if the microcontroller 24 detects a binary code, the microcontroller 24 may determine the associated location within the server/chassis and/or provide the binary code or location to the management controller 38.

Figure 4A:
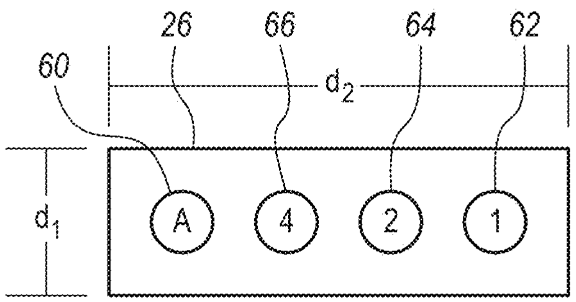
FIGS. 4A-E are schematic diagrams of various unique patterns of inwardly directed protrusions that may be scanned by a capacitive sensor according to one embodiment.
Figure 4B:
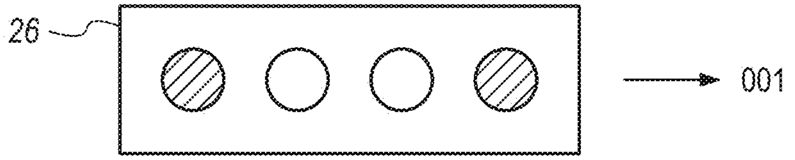
Figure 4C:
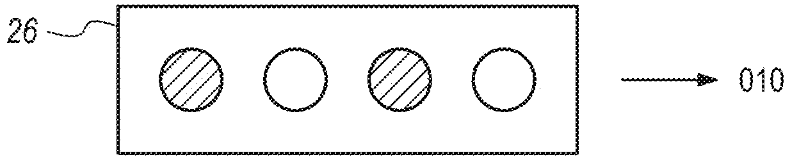
Figure 4D:
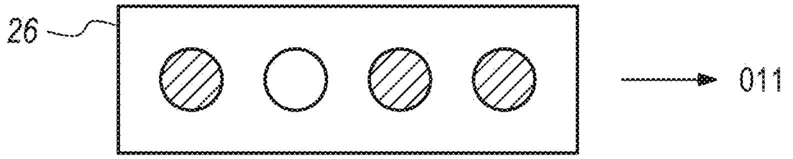
Figure 4E:
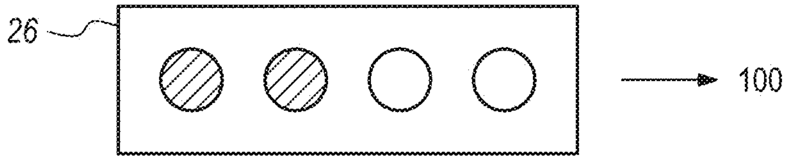

FIGS. 4A-E are schematic diagrams of various unique patterns of inwardly directed protrusions that may be scanned by a capacitive sensor 26 according to one embodiment. In FIG. 4A, the outline of the capacitive sensor 26 is illustrated having an area ($d_1 \times d_2$) that is of a sufficient size and shape for sensing any of the plurality of patterns of inward directed protrusions. For example, the capacitive sensor 26 may sense multiple protrusions either simultaneously or by scanning across the sensor area. In this example, each pattern of protrusions includes four dimples. Each dimple is a localized deformation of the metal wall. A first dimple 60 on the left-hand side of the pattern has been designated as an alignment feature ("A") and the remaining three dimples 62, 64, 66 to the right of the alignment feature have been designated as the one's place ("1"), the two's place ("2") and the four's place ("4") of a binary code (reading from right to left). The buffer area within the area 26 and around the protrusions provide for some dimensional tolerance in the components that position the capacitive sensor 26 relative to the unique pattern.

In FIGS. 4B-E, cross-hatching within a circle is used to indicate that a dimple has been formed in the chassis wall and is inwardly directed into the chassis. No cross-hatching within a circle is used to indicate a position or placeholder where no dimple has been formed. In FIGS. 4B-E, the alignment feature 60 is detected and located, but does not form part of the encoding. Rather, in FIG. 4B the three dimples 62, 64, 66 encode 001, in FIG. 4C the three dimples 62, 64, 66 encode 010, in FIG. 4D the three dimples 62, 64, 66 encode 011, and in FIG. 4E the three dimples 62, 64, 66 encode 100. These are all unique patterns of inwardly directed protrusions that are uniquely associated with a predetermined location for an expansion board 10 to be installed within the chassis 50 or on the server 30.

Figure 5:
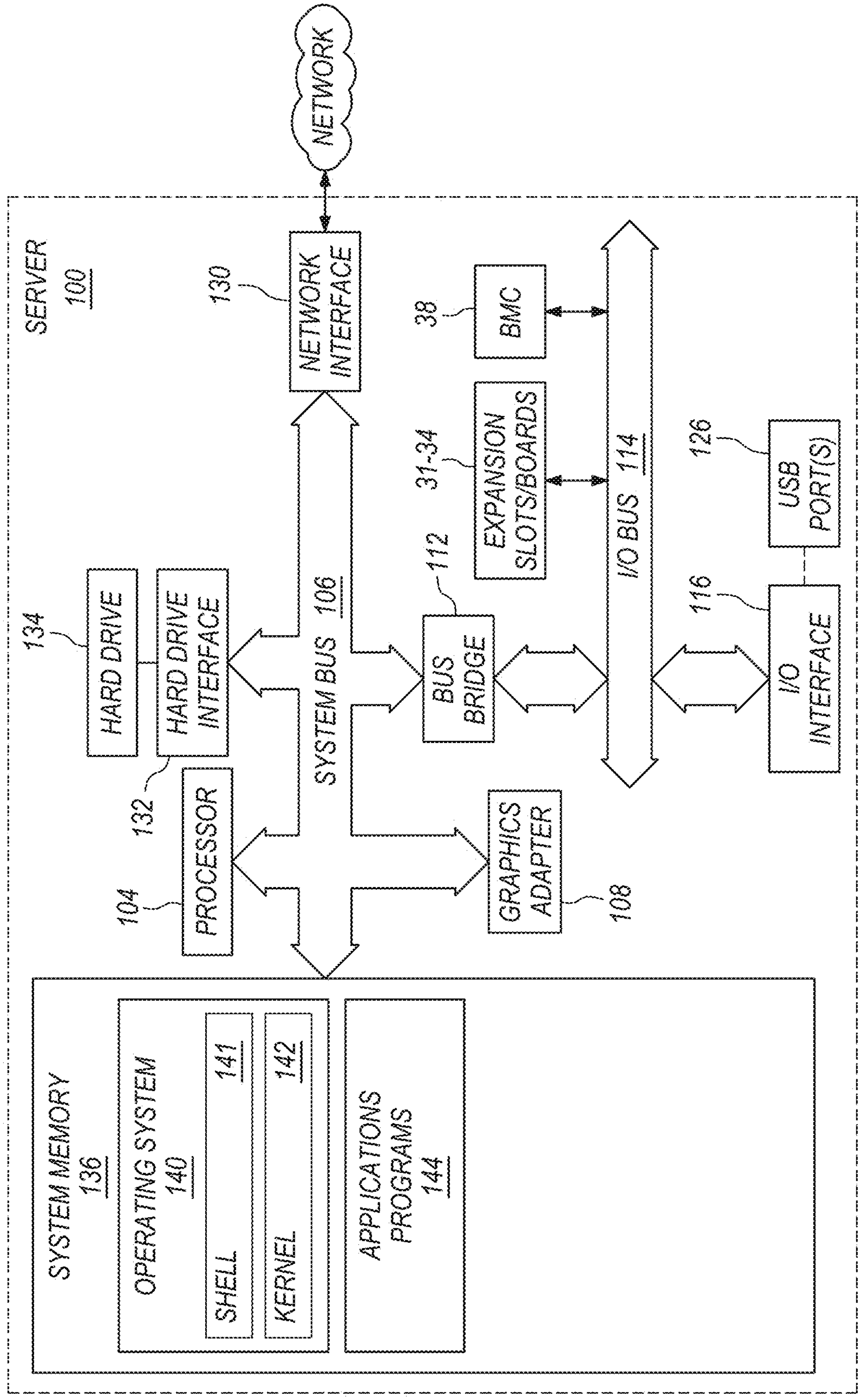
FIG. 5 is a diagram of a computer server according to some embodiments.

FIG. 5 is a diagram of a computer server 100 that may be, without limitation, representative of the motherboard 30 shown in FIGS. 2A-B. The server 100 includes a processor unit 104 that is coupled to a system bus 106. The processor unit 104 may utilize one or more processors, each of which has one or more processor cores. An optional graphics adapter 108, which may drive/support an optional display, is also coupled to system bus 106. The graphics adapter 108 may, for example, include a graphics processing unit (GPU). The system bus 106 may be coupled via a bus bridge 112 to an input/output (I/O) bus 114. An I/O interface 116 is coupled to the I/O bus 114, where the I/O interface 116 affords a connection with various optional I/O devices, such as a camera, a keyboard (such as a touch screen virtual keyboard), and a USB component via the USB port(s) 126 (or other type of pointing device, such as a trackpad). As depicted, the computer 100 is able to communicate with other network devices over a network using a network adapter or network interface controller 130.

A hard drive interface 132 is also coupled to the system bus 106. The hard drive interface 132 interfaces with a hard drive 134. In a preferred embodiment, the hard drive 134 may communicate with system memory 136, which is also coupled to the system bus 106. The system memory may be volatile or non-volatile and may include additional higher levels of volatile memory (not shown), including, but not limited to, cache memory, registers and buffers. Data that populates the system memory 136 may include the operating system (OS) 140 and application programs 144. The hardware elements depicted in the server 100 are not intended to be exhaustive, but rather are representative.

The operating system 140 includes a shell 141 for providing transparent user access to resources such as application programs 144. Generally, the shell 141 is a program that provides an interpreter and an interface between the user and the operating system. More specifically, the shell 141 may execute commands that are entered into a command line user interface or from a file. Thus, the shell 141, also called a command processor, is generally the highest level of the operating system software hierarchy and serves as a command interpreter. The shell may provide a system prompt, interpret commands entered by keyboard, mouse, or other user input media, and send the interpreted command(s) to the appropriate lower levels of the operating system (e.g., a kernel 142) for processing. Note that while the shell 141 may be a text-based, line-oriented user interface, the present invention may support other user interface modes, such as graphical, voice, gestural, etc.

As depicted, the operating system 140 also includes the kernel 142, which includes lower levels of functionality for the operating system 140, including providing essential services required by other parts of the operating system 140 and application programs 144. Such essential services may include memory management, process and task management, disk management, and mouse and keyboard management. In addition, the computer 100 may include application programs 144 stored in the system memory 136.

Still further, the server 100 may include a service processor, such as the BMC 38. The BMC is considered to be an out-of-band controller and may monitor and control various components of the server 100, such as expansion boards installed in the one or more expansion slots 31-34.

Figures 6, 7:
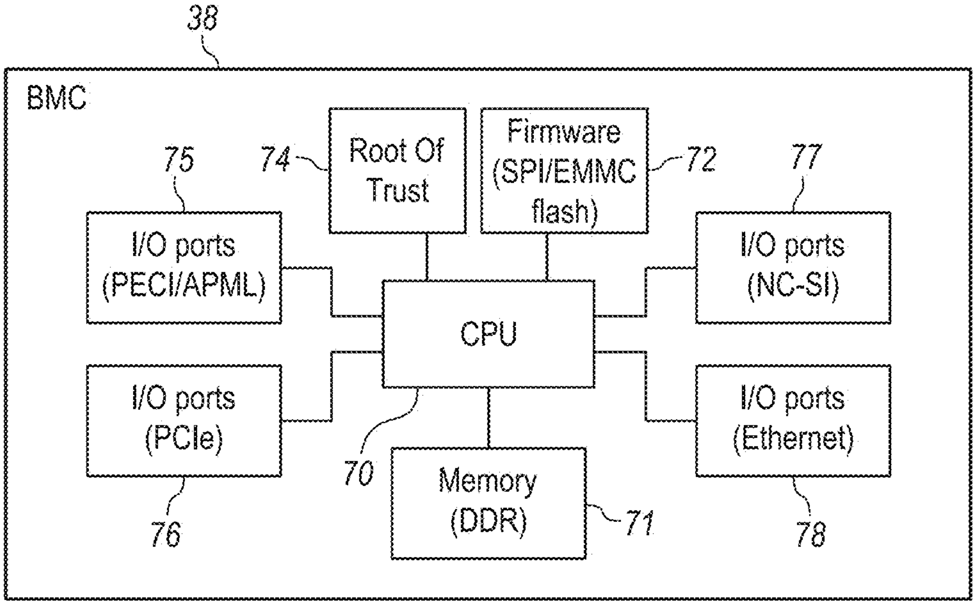
FIG. 6 is a diagram of a baseboard management controller according to some embodiments.
FIG. 7 is a table including records associating a unique pattern of inwardly directed protrusions with a location of the expansion board within the server or chassis.

FIG. 6 is a diagram of the baseboard management controller (BMC) 38 according to some embodiments. The BMC 38 is similar to a small computer or system on a chip (SoC), including a central processing unit (CPU) 70 (which is a separate entity from the central processing unit 22 in FIG. 1), memory 71 (such as random-access memory (RAM) on a double data rate (DDR) bus), firmware 72 on a flash memory (such as an embedded multi-media card (eMMC) flash memory or a serial peripheral interface (SPI) flash memory), and a root of trust (RoT) chip 74. The BMC 38 further includes a wide variety of input/output ports. For example, the input/output (I/O) ports may include I/O ports 75 to the hardware components of the server, such as a Platform Environment Control Interface (PECI) port and/or an Advanced Platform Management Link (APML) port; I/O ports 76 to the hardware components of the servers and/or a network interface controller (NIC), such as a Peripheral Component Interconnect Express (PCIe) port; I/O ports 77 to the NIC, such as a network controller sideband interface (NC-SI) port; and I/O ports 78 to a network that accessible to an external user, such as an Ethernet port. The BMC 38 may use any one or more of these I/O ports to interact with hardware devices installed on the server to obtain hardware performance data for the hardware devices.

FIG. 7 is a table 80 including records (illustrated as rows) associating a unique pattern of inwardly directed protrusions (column 82) with a location of the expansion board within the server or chassis (column 84). Consistent with other Figures (ignoring the alignment feature), a first record associates the unique pattern 001 with the front, left expansion slot of the server/chassis; a second record associates the unique pattern 010 with the rear, left expansion slot of the server/chassis; a third record associates the unique pattern 011 with the rear, right expansion slot of the server/chassis; and a fourth record associates the unique pattern 100 with the front, right expansion slot of the server/chassis. Such a table or similar data structure may be used by either the microcontroller or the management controller to use the unique pattern read by the capacitive sensor to identify the location of the expansion card whose capacitive sensor read the unique pattern.

As will be appreciated by one skilled in the art, embodiments may take the form of a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Any combination of one or more computer readable storage medium(s) may be utilized. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device. Furthermore, any program instruction or code that is embodied on such computer readable storage media (including forms referred to as volatile memory) that is not a transitory signal are, for the avoidance of doubt, considered "non-transitory".

Program code embodied on a computer readable storage medium may be transmitted using any appropriate medium, including but not limited to wireless, wireline, optical fiber cable, RF, etc., or any suitable combination of the foregoing. Computer program code for carrying out various operations may be written in any combination of one or more programming languages, including an object-oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Embodiments may be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, and/or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored on computer readable storage media is not a transitory signal, such that the program instructions can direct a computer, other programmable data processing apparatus, or other devices to function in a particular manner, and such that the program instructions stored in the computer readable storage medium produce an article of manufacture.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to limit the scope of the claims. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the embodiment.

The corresponding structures, materials, acts, and equivalents of all means or steps plus function elements in the claims below are intended to include any structure, material, or act for performing the function in combination with other claimed elements as specifically claimed. Embodiments have been presented for purposes of illustration and description, but it is not intended to be exhaustive or limited to the embodiments in the form disclosed. Many modifications and variations will be apparent to those of ordinary skill in the art after reading this disclosure. The disclosed embodiments were chosen and described as non-limiting examples to enable others of ordinary skill in the art to understand these embodiments and other embodiments involving modifications suited to a particular implementation.

What is claimed is:

1. An expansion board, comprising:

a printed circuit board;

an electronic subsystem supported on the printed circuit board and configured to expand the capabilities of a motherboard;

a connector for connecting the electronic subsystem to the motherboard, wherein the connector includes conductors for receiving power from the motherboard and conductors for communicating with the motherboard;

a capacitive sensor secured to the printed circuit board in a predetermined physical position and orientation on the printed circuit board for non-contact alignment with a pattern of inwardly-directed protrusions formed in an exterior metal wall of a chassis containing the motherboard when the connector is fully seated in an expansion board connector on the motherboard, wherein the capacitive sensor is configured to detect changes in capacitance at each location of a protrusion in the pattern of inwardly-directed protrusions when the capacitive sensor is positioned in non-contact alignment with the pattern of protrusions; and a microcontroller connected to the output of the capacitive sensor and configured to receive from the capacitive sensor an output signal identifying the relative positions of the protrusions.

2. The expansion board of claim 1, wherein the microcontroller stores data identifying, for each of a plurality of patterns of protrusions, a location within the chassis that is respectively associated with the pattern of inwardly directed protrusions, wherein each of the plurality of patterns of protrusions is unique within the plurality of patterns of protrusions.

3. The expansion board of claim 2, wherein the microcontroller uses the output signal identifying the relative positions of the protrusions to identify the unique pattern of inwardly directed protrusions and determines the expansion board to be installed in the location within the chassis that is associated with the identified unique pattern of inwardly directed protrusions.

4. The expansion board of claim 3, wherein the microcontroller is configured to provide the location where the expansion board is installed to a management controller on the motherboard.

5. The expansion board of claim 1, wherein the chassis includes a plurality of exterior metal walls, and wherein a plurality of different patterns of protrusions are formed in one or more of the exterior metal walls.

6. The expansion board of claim 5, wherein the plurality of exterior metal walls are sheet metal walls.

7. The expansion board of claim 5, wherein each of the different patterns of inwardly directed protrusions forms a binary code.

8. The expansion board of claim 1, wherein each unique pattern of inwardly directed protrusions includes a plurality of protrusions that are uniquely arranged in one of a plurality of predetermined patterns or spacings.

9. The expansion board of claim 1, wherein each of the protrusions in the unique pattern of inwardly directed protrusions have a uniform size and shape.

10. The expansion board of claim 1, wherein the exterior metal wall of the chassis includes a planar surface, the protrusions extend inward from the planar surface a first distance of between 1 and 10 millimeters, and wherein a second distance between the capacitive sensor and the protrusions is between 2 and 10 millimeters at the closest point when the connector is fully seated in the expansion board connector on the motherboard.

11. The expansion board of claim 1, wherein each unique pattern of inwardly directed protrusions includes a plurality of protrusions arranged in a unique combination of predetermined positions within a multi-position row or matrix.

12. The expansion board of claim 11, wherein each unique pattern of inwardly directed protrusions includes one alignment protrusion that is in a position that is common to each of the multiple unique patterns of inwardly directed protrusions.

13. The expansion board of claim 12, wherein the microcontroller identifies a capacitive output signal level from the capacitive sensor for the alignment protrusion and determines, based on the identified capacitive output signal level, a range of capacitive output signal levels for positive indication of the presence and location of other protrusions within the unique pattern of inwardly directed protrusions.

14. The expansion board of claim 1, wherein the connector is an edge connector configured for fully seating within a connector slot on the motherboard.

15. The expansion board of claim 1, wherein the expansion board is a riser card having one or more connectors slots secured on a first side of the printed circuit board, and wherein the capacitive sensor is secured to a second side of the printed circuit board opposite the first side.

16. The expansion board of claim 1, wherein the expansion board is selected from a PCIe riser, data storage drive backplane, power distribution board, power interface board and Compute Express Link (CXL) memory module.

17. A system, comprising:

a chassis including a plurality of sheet metal walls and a plurality of unique patterns of inward directed protrusions formed in the sheet metal walls in predetermined locations;

a motherboard secured in the chassis and including a plurality of expansion board connectors, wherein each expansion board connector is secured at a specific location on the motherboard to have a predetermined physical spacing and orientation relative to the predetermined location of one of the unique patterns of protrusions; and an expansion board including:

a printed circuit board;

an electronic subsystem supported on the printed circuit board and configured to expand the capabilities of the motherboard;

a connector for connecting the electronic subsystem to the motherboard, wherein the connector includes conductors for receiving power from the motherboard and conductors for communicating with the motherboard;

a capacitive sensor secured to the printed circuit board in a predetermined physical position and orientation on the printed circuit board for close non-contact alignment with one of the unique patterns of inwardly-directed protrusions when the connector is fully seated in one of the expansion board connectors on the motherboard, wherein the capacitive sensor is configured to detect changes in capacitance for each protrusion in the unique pattern of inwardly-directed protrusions that is positioned in close non-contact alignment with the capacitive sensor; and a microcontroller connected to the output of the capacitive sensor to receive from the capacitive sensor an output signal identifying the relative positions of the protrusions.

18. The expansion board of claim 17, wherein the microcontroller stores data identifying, for each of a plurality of unique patterns of protrusions, a location within the chassis that is associated with the unique pattern of inwardly directed protrusions, and wherein the microcontroller uses the output signal identifying the relative positions of the protrusions to identify the unique pattern of inwardly directed protrusions and determines the expansion board is installed in the location within the chassis that is associated with the identified unique pattern of inwardly directed protrusions.

19. The system of claim 18, further comprising:

a management controller on the motherboard connected to each of the plurality of expansion board connectors, wherein the management controller obtains the location where the expansion board is installed from the microcontroller.

20. The system of claim 17, wherein each unique pattern of inwardly directed protrusions includes a plurality of protrusions arranged in a unique combination of predetermined positions within a multi-position row or matrix, wherein at least one of the plurality of protrusions is an alignment protrusion that is in a position that is common to each of the unique patterns of inwardly directed protrusions.

* * * * *